United States Patent [19]

Makita

[11] Patent Number: 5,305,750

[45] Date of Patent: Apr. 26, 1994

[54] NECK BENDING APPARATUS

[75] Inventor: Junichi Makita, Tokyo, Japan

[73] Assignee: Kabushiki Kaisha Toshiba, Kawasaki, Japan

[21] Appl. No.: 717,664

[22] Filed: Jun. 19, 1991

[30] Foreign Application Priority Data

Jun. 19, 1990 [JP] Japan .................................. 2-160344

[51] Int. Cl.$^5$ .............................................. A61B 5/05
[52] U.S. Cl. ......................... 128/653.5; 128/118.100; 128/845
[58] Field of Search ................... 128/653.05, 845, 857, 128/869, 118.1; 324/318

[56] References Cited

U.S. PATENT DOCUMENTS

| | | | |
|---|---|---|---|
| 4,981,131 | 1/1991 | Hazard | 128/118.1 |
| 5,007,425 | 4/1991 | Vanek et al. | 128/653.5 |
| 5,060,661 | 8/1991 | Howard | 128/845 |
| 5,113,875 | 5/1992 | Bennett | 128/845 |

*Primary Examiner*—Lee S. Cohen
*Assistant Examiner*—Jeffrey R. Jastrzab
*Attorney, Agent, or Firm*—Oblon, Spivak, McClelland, Maier & Neustadt

[57] ABSTRACT

A neck bending apparatus is utilized in association with a coil device of a magnetic resonance imaging system for imaging a forwardly or rearwardly bent condition of the neck portion of the patient. The apparatus includes a plurality of air cushions having variable inner volumes and an air regulator connected to the cushions for regulating the inner volume of each of the cushions in accordance with a degree of bending of the neck portion of the patient. Two cushions are utilized for imaging the neck portion of the patient for resting the head and neck portions and these cushions are connected through a connecting member. The air regulator includes a handgrip air pump for feeding air into and out of the air cushions, a tube connecting the pump and the cushions and a valve unit connected to the tube for regulating the amount of air fed into and out of the air cushions. In association with the apparatus, the magnetic resonance imaging system is utilized, which includes a coil device including a rest portion on which a subject portion of the patient is rested, a coil unit having substantially an elliptical shape, a coil support portion which is detachably secured to the rest portion and in which the coil unit is disposed and an attachment portion attached to a top board on which the patient is laid.

9 Claims, 3 Drawing Sheets

NECK BENDING APPARATUS

BACKGROUND OF THE INVENTION

The present invention relates to a neck bending apparatus and more particularly to an apparatus for bending or flexing a cervical region, i.e. a so-called neck portion, of a patient who is lying down, which is utilized in association with an MR (Magnetic Resonance) imaging system for imaging a condition of the neck portion of the patient. The magnetic resonance imaging system is one for utilizing a magnetic resonance phenomenon and inspecting the condition of the patient body in response to a magnetic resonance signal from the patient.

Generally, when it is required to diagnose cervical disk herniatron, rear vertical sclerodesmia and the like of a patient, forward or rearward bending or flexture condition of the neck portion of the patient is diagnosed by utilizing an X-ray imaging system. On the other hand, a magnetic resonance imaging (MRI) system is also utilized, as a system superior to the X-ray imaging system, for the extraction of centram, intervertebral disk, myelon and the like. In view of the above fact, recently, there has been an increased demand for utilizing the MRI system for the imaging of the forwardly or rearwardly, i.e. backward, bending condition of the neck portion of the patient.

The principal theory of the MRI system is as follows.

The MRI system carries out an imaging operation by assuming a subject portion of a patient as a plurality of sliced imaging surfaces and the MRI system includes a coil device having an opening into which only a subject portion or a body portion including the subject portion of the patient to be imaged is arranged. When, under this condition, the MRI system is operated, a uniform magnetostatic field is formed in the coil device into which the subject portion of the patient is positioned. Next, an oblique magnetic field is multiplied to the magnetostatic field and a high frequency pulse of magnetic resonance frequency (RF pulse) corresponding to a desired sliced surface of the subject portion of the patient is applied to this magnetic field to cause the magnetic resonance phenomenon to the subject portion to be imaged. During this operation, an MR signal is caused to the subject portion of the patient and the MR signal recieved is then subjected to an image recomposition processing to thereby form a magnetic resonance radiotomy image (MR image) of the desired sliced surface of the subject portion of the patient.

In a conventional MRI system including a coil device utilized for imaging neck and head portions of the patient, the coil device is equiped with a circular or elliptic coil having a reduced inner diameter for improving an S/N (signal-to-nosie ratio). Accordingly, in the conventional MRI system, the patient cannot bend his neck portion once positioned in the coil, so that the imaging of the neck portion was carried out with the neck portion being not bent. Thus, the subject portion, i.e. the neck portion of the patient may not be precisely diagnosed.

SUMMARY OF THE INVENTION

An object of the present invention is to substantially eliminate the defects or drawbacks encountered in the prior art and to provide a neck bending apparatus utilized in association with a magnetic resonance imaging system capable of carrying out effectively magnetic resonance imaging operation of a forward or rearward bent neck condition of a patient.

This and other objects can be achieved according to the present invention by providing an apparatus for bending a neck portion of a living human body which is to be utilized in association with a coil device of a magnetic resonance imaging system for imaging a forwardly or rearwardly bent condition of the living human body in a lying position, the apparatus comprising a plurality of cushion means having a variable inner volume and a regulating means connected to the cushion means for regulating the inner volume of the cushion means in accordance with degree of bending of the neck portion of the living human body.

In a preferred embodiment, the cushion means comprises at least two pad-like air cushions variable in inner volumes for supporting a neck portion and a head portion of the living human body laid and a connecting member for connecting the air cushions.

The regulating means comprises a hand-grip air pump for feeding air into and out of the air cushions, a tube connecting the pump and the cushions and a valve unit incorporated in the tube for regulating the amount of air fed into and out of the air cushions. The valve unit has a structure to allow the air in the pump means to flow into only one of the cushion means and to prevent the air in one or both cushion means from flowing out.

In association with the apparatus described above, the magnetic resonance imaging system is utilized, which includes a coil device comprising a rest portion on which a subject portion of the living human body is rested, a coil unit having substantially an elliptical shape, a coil support portion which is detachably secured to the rest portion and in which the coil unit is disposed, and an attachment portion to be attached to a top board on which the living human body is laid.

According to the neck bending apparatus with the characteristics described above, when it is required to carry out the MR imaging operation to a neck portion in a forwardly bent state, the inner volume of the air cushion for the head portion of the patient is increased by the air pump more than the inner volume of the air cushion for the neck portion, whereas, in the reverse case of the MR imgaing operation of the neck portion in a rearwardly bent state, the inner volumes of the air cushions are reversely changed.

Accordingly, the MR imaging operation of the neck portion of the patient can be effectively done in association with the operation of the MRI system.

BRIEF DESCRIPTION OF THE DRAWINGS

For a better understanding of the present invention and to show how the same is carried out, reference is made to, by way of a preferred embodiment, accompanying drawings, in which.

DESCRIPTION OF THE PREFERRED EMBODIMENTS

One embodiment of a cervical region, i.e. neck portion, bending apparatus according to the present invention will be described hereunder with reference to the accompanying drawings.

Figure 1:
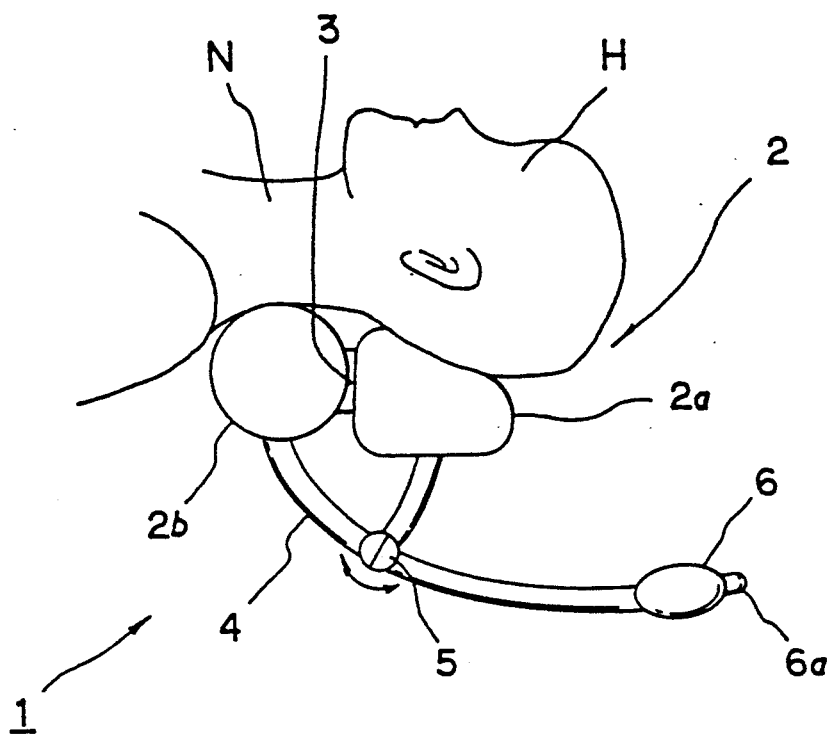
FIG. 1 is an illustration of a side view of a neck bending apparatus according to the present invention, in which head and neck portions of the patient are rested thereon.

First, referring to FIG. 1, the neck bending apparatus 1 comprises a plurality, two in a preferred embodiment, of pad-like air cushions 2a and 2b variable in their inner capacities or volumes and made of a flexible material such as rubber or a soft plastic material, a connecting member 3 for connecting the pad-like air cushions 2a and 2b with the distance therebetween being properly maintained, a pumping member 6 for feeding a fluid such as air into the air cushions 2a and 2b through a tube 4 and a valve 5 unit for regulating the flow amount of the air into the air cushions 2a and 2b through the tube 4.

The connecting member 3 has such a length that the air-cushions 2a and 2b connected to both ends of the connecting member 3 can suitably support a neck portion and a head portion of a living human body, referred to as a patient hereinafter, being laid horizontally, respectively. In this regard, one pad-like air cushion 2a may be referred to as a head support cushion 2a and the other referred to as a neck support cushion 2b. In a preferred embodiment, it is desired that the head support and neck support cushions 2a and 2b have inner volumes of about 1500 cc and 1000 cc, respectively.

The head and neck support cushions 2a and 2b are connected to the pumping member 6, which in this embodiment is a hand-grip type air pump of a hollow flexible structure, for suppling air in the air pump 6 into the cushions 2a and 2b which have variable inner volumes through the tube 4 on the way of which the valve unit 5 is incorporated. The air in the air pump 6 is fed by gripping the same by the hand of an operator and is provided with an exhaust port 6a such as an air cock capable of being opened and closed. The valve unit 5 has a structure to allow the air in the air pump 6 to flow into only one of the support cushions 2a and 2b and also prevent the air in one or both support cushions 2a and 2b from flowing out.

Figure 3A:
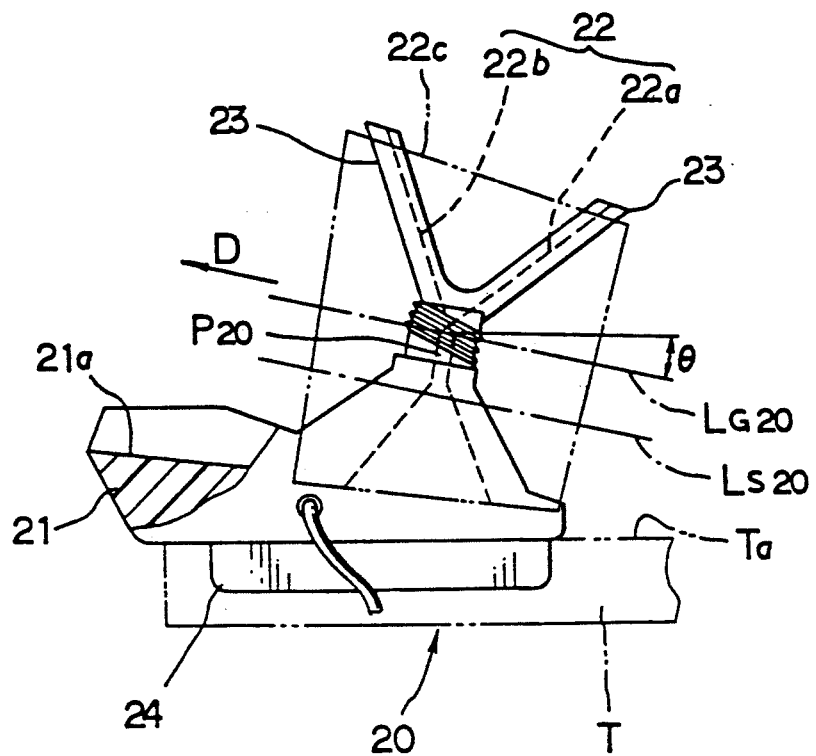
FIG. 3A is a side view of a coil device of an MRI system to which the present invention is applicable.
Figure 3B:
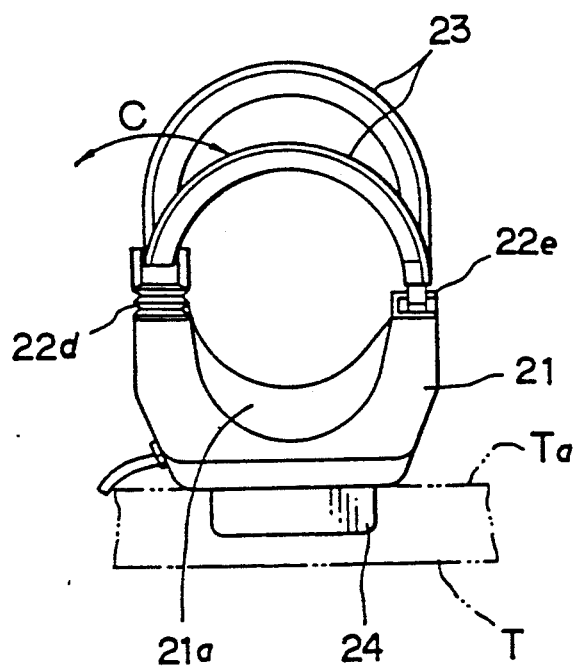
FIG. 3B is a plan view of the coil device of FIG. 3A.

FIG. 3A is a side view of a coil device 20 to which the neck bending apparatus is applicable and FIG. 3B is a right side view of the coil device 20.

Figure 2:
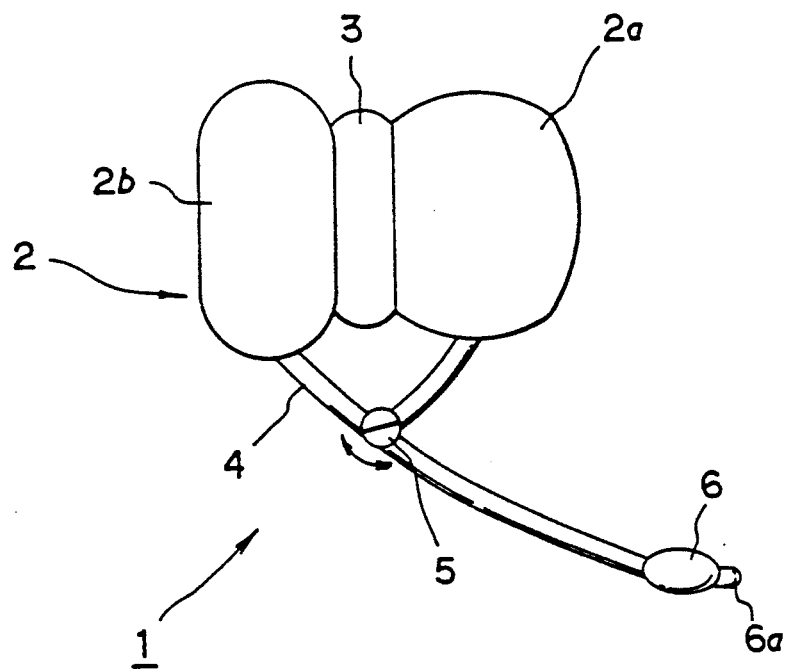
FIG. 2 is a plan view of the apparatus shown in FIG. 1.

Referring to FIGS. 2A and 3B, the coil device 20 in this embodiment is limited in use to a case where a subject portion of the patient to be imaged is the neck portion of the patient. The coil device 20, accordingly, comprises a neck and head rest portion 21 made of a material such as hard plastic and having a rest surface 21a, coil support portions 23 for supporting a coil unit 22 and a top board attachment portion 24 made of such as hard plastic material.

The coil unit 22 is composed of two coil members 22a and 22b and disposed in the coil support portions 23, respectively. The coil members 22a and 22b, hence the coil support portions 23, each has substantially an elliptic shape in outer appearance. These coil members 22a and 22b are assembled so as to interconnect each other entirely providing a substantially cylindrical outer shape 22c. Through the top board attachment portion 24, the neck and head rest portion 21 and the coil support portions 23 are detachably secured to one end of a top board T on which the patient lies.

In the illustrations, the interconnecting portion of the coil members 22a and 22b is denoted by a letter $P_{20}$ positioned at a portion downwardly excentric from a central axis $L_{G20}$ of the cylindrical coil shape 22c. A central axis $L_{S20}$ of an area in which a signal receiving sensitivity is made uniform is positioned at a portion downwardly eccentric from the central axis $L_{G20}$.

The coil unit 22 has two coil interconnecting portions at both the ends of the coil members 22a and 22b at the interconnecting portion $P_{20}$. At one end, these coils 22a and 22b are firmly connected, at a connected portion as denoted by reference numeral 22d, in a bendable manner, and at the other end, they are detachably connected by means of a connector 22e. Accordingly, when the head and neck portions of the patient is rested on the head and neck rest portion 21, the coil support portion 23 is opened and then closed, after resting of the head, in the direction of arrow C shown in FIG. 3B, thus easily resting and positioning the head and neck portions of the patient.

The coil unit 22 has a structure tiltable as a whole cylindrical shape 22c toward a direction D, i.e. in the head side, shown in FIG. 3A, and the central axis $L_{G20}$ of the cylindrical shape of the coil unit 22 is inclined by a certain angle $\theta$ with respect to the upper surface Ta of the top board T. According to such structure, the head of the patient does not abut against the coil support portions 23 even in raising the head, thus being capable of imaging the neck portion in the forwardly or rearwardly, i.e. backward, bent position.

The coil support portions 23 are made of resin material and flexible foaming material. Namely, the outside portions, i.e. outside of the coil members 22a and 22b, of the support portions 23 are made of the resin material so as to provide suitable rigidity and the inside portions which may abut against the patient body are made of the flexible foaming material so as not to injure the patient's body. In addition, it may be preferred to form the coil members 22a and 22b with a fine, good conductive material and hence to form the coil support portions 23 also with a fine material to impart a comfortable appearance or feeling to the patient laid on the top board T.

Figure 4:
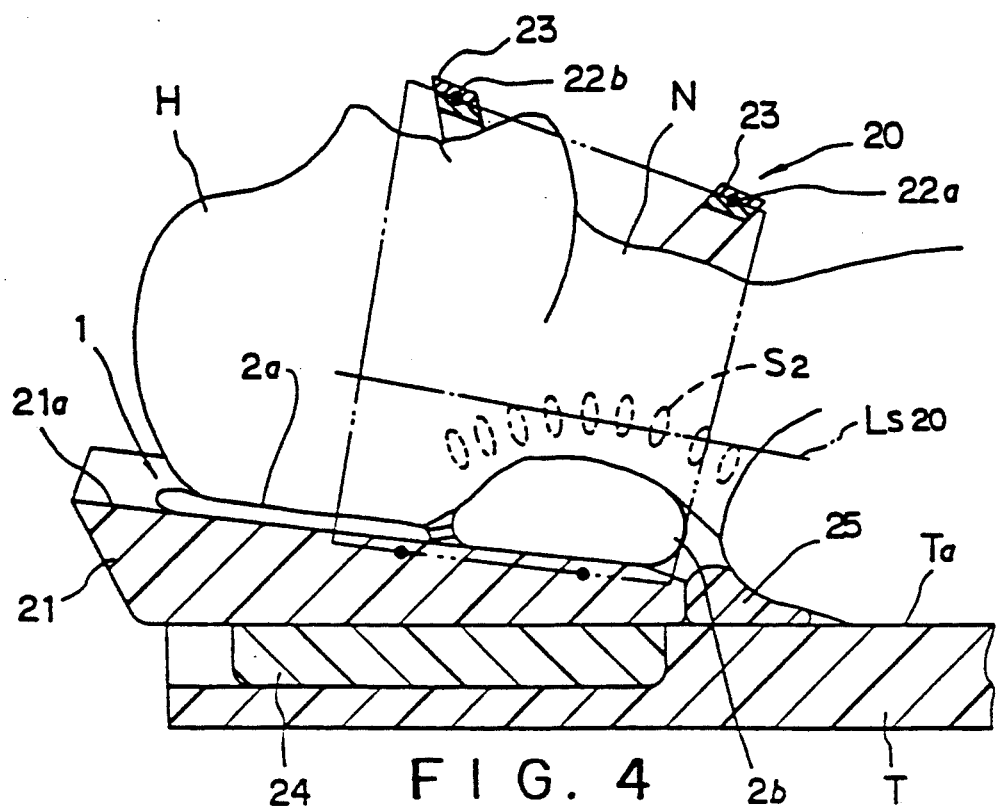
FIGS. 4 and 5 are side views of the combined use of the neck bending apparatus of FIG. 1 or 2 with the coil device of FIG. 3, respectively showing the neck condition bent forwardly and rearwardly.
Figure 5:
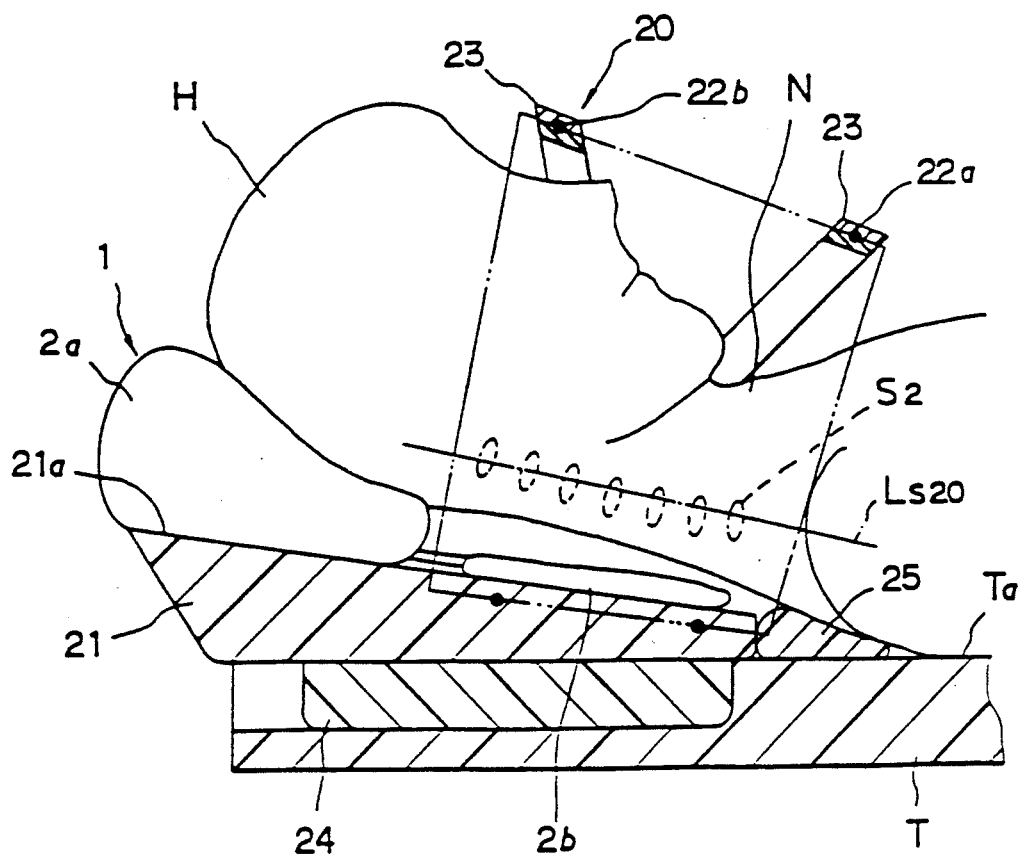

The neck bending apparatus 1 of the, structure described above will operate as described hereafter with reference to FIGS. 4 and 5.

FIGS. 4 and 5 show the states in which the neck bending apparatus 1 according to the present invention is used in combination with the coil device 20 for carrying out an MR imaging of the neck portion in the forwardly or rearwardly bent position, wherein FIG. 4 shows the forwardly bent position and FIG. 5 shows the rearwardly bent position of the neck portion of the patient body. Reference numeral 25 denotes a mat for supporting the back of the patient laid on the top board T.

The top board attachment portion 24 of the coil device 24 is first attached to the top board T. The pad-like air cushions 2a and 2b are then settled on the head and neck rest portion 21a with a distance suitable for the head and neck of the patient to be inspected. The connector 22e is disengaged to open the coil support portions 23 to thereby rest the head portion H and the neck portion N of the patient on the air cushions 2a and 2b.

Under these states, when the imaging of the neck portion N in the rearwardly bent state is first carried out, an operator operates the air pump 6 by gripping the same and adjusts the valve unit 5 to entirely exhaust the air in the head support cushion 2a through the exhaust port 6a of the air pump 6. Subsequently, the operator operates the air pump 6 and adjusts the valve unit 5 to regulate the amount of the air in the neck support cushion 2b to 250 to 300 cc, for example. In this state, the neck portion N is raised to bend the same rearwardly as shown in FIG. 4.

Under this state, when MR imaging is carried out, the position of the cervical vertebrae $S_2$ of the neck portion N substantially aligns with the central axis $L_{S20}$ of the area in which the signal receiving sensitivity is made substantially uniform, and hence, the MR signal in good receiving condition from the cervical vertebrae $S_2$ can be received.

When it is required to carry out the imaging operation of the neck portion N in the forwardly bent state, the operator operates the air pump 6 and adjusts the valve unit 5 to feed the air into the head support cushion 2a in the amount of 300 to 500 cc, for example, and then to entirely exhaust the air in the neck support cushion 2b through the exhaust port 6a of the air pump 6. In this state, the head portion H is raised so as to bend the neck portion forwardly as shown in FIG. 5.

Under the state, when the MR imaging is carried out, the cervical vertebrae $S_2$ of the neck portion N substantially aligns with the central axis $L_{S20}$ of the area in which the signal receiving sensitivity is made substantially uniform, and hence, the MR signal is in a good receiving condition from the cervical vertebrae $S_2$ and can be received.

As described above, according to the neck bending apparatus of the present invention in the use combined with the coil device 20 of the MRI system of the characters described above, MR imaging of the forwardly or rearwardly bent condition of the neck portion of the patient can be effectively performed.

In the described and illustrated embodiment, although the hand-grip type air pump is provided, another pumping means such as automatically operated electric or hydraulic pump may be utilized instead of the hand-grip type air pump 6.

Furthermore, in the described embodiment, the apparatus of the present invention is described in a case where the apparatus is applied to the coil device of the MRI system for imaging the neck portion of the patient, but it is to be easily understood that the apparatus may be applied to other subject portions of the patient in combination with the MRI system for imaging these portions.

What is claimed is:

1. An apparatus for bending a neck portion of a patient and which is utilized in association with a coil device of a magnetic resonance imaging system for imaging a forwardly or rearwardly bent condition of the neck portion of the patient in a lying position, the apparatus comprising:
   a head and neck supporting cushion adapted to be positioned in the coil device, the cushion having a variable inner volume and comprising at least two pad-like air cushions, which are connected with each other, with variable inner volumes for respectively supporting the neck portion and a head portion of the patient in the lying position; and
   a regulator connected to the cushions for regulating the inner volume of the cushions in accordance with an inclination of the neck portion on one of the pad-like air cushions for the purpose of imaging, said one of the pad-like air cushions being adapted to be disposed in an imaging area of the coil device.

2. The apparatus according to claim 1, wherein said cushions each comprise a flexible and resilient material.

3. The apparatus according to claim 2, wherein the flexible and resilient material comprises a rubber material.

4. The apparatus according to claim 2, wherein the flexible and resilient material comprises a soft plastic material.

5. The apparatus according to claim 1, wherein said regulator comprises a pump for feeding air into and out of the cushions, a tube connecting the pump and the cushions, and a valve connected to the tube for regulating an amount of air fed into and out of the cushions.

6. The apparatus according to claim 5, wherein said pump comprises a hand-grip type air pump provided with an air exhaust port.

7. The apparatus according to claim 5, wherein said valve comprises a mechanism for allowing the air in the pump to flow into only one of the cushions and to prevent the air in at least one of the cushions from flowing out.

8. The apparatus according to claim 1, which comprises a connecting member connecting the air cushions, wherein said connecting member is made of a flexible material and has a length dimensioned so that said cushions are positioned a distance apart between the neck portion and the head portion of the patient.

9. A coil system for a magnetic resonance imaging system for imaging a forwardly or rearwardly bent condition of a neck portion of a patient in a lying position, the coil system comprising:
   a coil device comprising a rest portion on which a neck and head portion of a patient is rested, a coil unit having a substantially elliptical shape, a coil support portion which is detachably secured to the rest portion and in which the coil unit is disposed, a top board on which the patient is laid wherein the top board is connected to the rest portion, and an attachment portion attached to said top board on which the patient is laid;
   a head and neck supporting cushion disposed inside the coil unit of the coil device and having a variable inner volume, said cushion comprising at least two pad-like air cushions, which are connected with each other, said air cushions having variable inner volumes for respectively supporting the neck portion and a head portion of the patient in the lying position; and
   a regulator connected to the air cushions for regulating the inner volume of the air cushions in accordance with an inclination of the neck portion on one of the pad-like air cushions for the purpose of imaging, said one of the pad-like air cushions being disposed in an imaging area of the coil unit.

* * * * *